(12) United States Patent  (10) Patent No.: US 9,063,605 B2
Feinstein et al.  (45) Date of Patent: Jun. 23, 2015

(54) THIN GLASS PROCESSING USING A CARRIER

(75) Inventors: Casey J. Feinstein, San Jose, CA (US); John Z. Zhong, Cupertino, CA (US); Lynn R. Youngs, Cupertino, CA (US); Stephen S. Poon, San Jose, CA (US)

(73) Assignee: Apple Inc., Cupertino, CA (US)

( * ) Notice: Subject to any disclaimer, the term of this patent is extended or adjusted under 35 U.S.C. 154(b) by 933 days.

(21) Appl. No.: 13/234,072

(22) Filed: Sep. 15, 2011

(65) Prior Publication Data

US 2012/0009703 A1   Jan. 12, 2012

Related U.S. Application Data

(60) Continuation-in-part of application No. 12/908,763, filed on Oct. 20, 2010, now Pat. No. 8,997,339, which is a division of application No. 12/351,767, filed on Jan. 9, 2009, now Pat. No. 7,918,019.

(51) Int. Cl.
*H05K 3/02* (2006.01)
*H05K 3/10* (2006.01)
(Continued)

(52) U.S. Cl.
CPC .......... *G06F 3/0416* (2013.01); *Y10T 29/49155* (2015.01); *G02F 1/1333* (2013.01); *G02F 1/1368* (2013.01); *G06F 3/044* (2013.01); *H01L 27/1266* (2013.01)

(58) Field of Classification Search
CPC . G02F 1/1333; G02F 1/1368; H01L 27/1266; G06F 3/044; G06F 3/0416; H05K 3/0097; H05K 1/0306; H05K 2203/1536; H05K 2201/0317; H05K 2201/0326

USPC .................. 29/830, 831, 846, 847, 415, 423; 174/256; 216/23; 438/57
See application file for complete search history.

(56) References Cited

U.S. PATENT DOCUMENTS 5,483,261 A   1/1996  Yasutake
5,488,204 A   1/1996  Mead et al.
(Continued)

FOREIGN PATENT DOCUMENTS

CN   1694589       11/2005
CN   1694589  A    11/2005
(Continued)

OTHER PUBLICATIONS

Final Office Action mailed Jun. 24, 2011, for U.S. Appl. No. 12/163,701, filed Jun. 27, 2008, 12 pages.
(Continued)

*Primary Examiner* — Donghai D Nguyen
(74) *Attorney, Agent, or Firm* — Joseph F. Guihan

(57) ABSTRACT

A method of fabricating a display panel from a thin substrate using a carrier substrate is disclosed. The method includes depositing a bonding agent on a first surface of the thin substrate; depositing a bonding agent on a second surface of the carrier substrate; bonding the thin substrate and the carrier substrate with the bonding agent deposited on the first surface and the second surface; performing thin film processing on a third surface of the thin substrate opposite the first surface; and separating the processed thin substrate from the carrier substrate. The thin substrate has a thickness less than a required thickness for sustaining thin film processing while a thickness of the bonded thin substrate and the carrier substrates is greater than or equal to that the required thickness.

21 Claims, 7 Drawing Sheets

(51) Int. Cl.
*G06F 3/041* (2006.01)
*G02F 1/1333* (2006.01)
*G06F 3/044* (2006.01)
*H01L 27/12* (2006.01)
*G02F 1/1368* (2006.01)

(56) References Cited

U.S. PATENT DOCUMENTS

| | | | |
|---|---|---|---|
| 5,766,493 | A | 6/1998 | Shin et al. |
| 5,816,225 | A | 10/1998 | Koch et al. |
| 5,825,352 | A | 10/1998 | Bisset et al. |
| 5,835,079 | A | 11/1998 | Shieh |
| 5,880,411 | A | 3/1999 | Gillespie et al. |
| 6,166,915 | A | 12/2000 | Lake et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,327,011 | B2 | 12/2001 | Kim |
| 6,350,664 | B1 | 2/2002 | Haji et al. |
| 6,690,387 | B2 | 2/2004 | Zimmerman et al. |
| 6,955,971 | B2 | 10/2005 | Ghyselen et al. |
| 7,015,894 | B2 | 3/2006 | Morohoshi |
| 7,184,064 | B2 | 2/2007 | Zimmerman et al. |
| 7,663,607 | B2 | 2/2010 | Hotelling et al. |
| 7,918,019 | B2 | 4/2011 | Chang et al. |
| 8,673,163 | B2 * | 3/2014 | Zhong et al. ............ 216/23 |
| 2003/0057183 | A1 | 3/2003 | Cho et al. |
| 2004/0142118 | A1 | 7/2004 | Takechi |
| 2005/0245165 | A1 | 11/2005 | Harada et al. |
| 2006/0026521 | A1 | 2/2006 | Hotelling et al. |
| 2006/0097991 | A1 | 5/2006 | Hotelling et al. |
| 2006/0197753 | A1 | 9/2006 | Hotelling |
| 2006/0250559 | A1 | 11/2006 | Bocko et al. |
| 2006/0292822 | A1 | 12/2006 | Xie |
| 2007/0196578 | A1 | 8/2007 | Karp et al. |
| 2008/0053604 | A1 | 3/2008 | Kim et al. |
| 2008/0070340 | A1 * | 3/2008 | Borrelli et al. ............ 438/57 |
| 2008/0135175 | A1 | 6/2008 | Higuchi |
| 2008/0261057 | A1 | 10/2008 | Slobodin |
| 2009/0091551 | A1 | 4/2009 | Hotelling et al. |
| 2010/0267203 | A1 | 10/2010 | Chen et al. |
| 2011/0030209 | A1 | 2/2011 | Chang et al. |

FOREIGN PATENT DOCUMENTS

| | | |
|---|---|---|
| CN | 101025502 A | 8/2007 |
| CN | 101206314 A | 6/2008 |
| EP | 1 592 073 A1 | 11/2005 |
| JP | 52-031757 A | 3/1977 |
| JP | 05-249422 A | 9/1993 |
| JP | 09-312245 A | 12/1997 |
| JP | 09312245 | 12/1997 |
| JP | 2000-163031 A | 6/2000 |
| JP | 2002-342033 A | 11/2002 |
| WO | WO-2009/003029 -2 | 12/2008 |
| WO | WO-2010/080988 A2 | 7/2010 |
| WO | WO-2010/080988 A3 | 7/2010 |

OTHER PUBLICATIONS

International Search Report mailed Jul. 21, 2010, for PCT Application No. PCT/US2010/020485, filed Jan. 8, 2010, six pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non Final Office Action mailed May 18, 2010, for U.S. Appl. No. 12/351,767, filed Jan. 9, 2009, five pages.

Non-Final Office Action mailed Feb. 11, 2011, for U.S. Appl. No. 12/163,701, filed Jun. 27, 2008, seven pages.

Notice of Allowance mailed Sep. 17, 2010, for U.S. Appl. No. 12/351,767, filed Jan. 9, 2009, six pages.

Ohkuma, H. (2000). "Development of a Manufacturing Process of a Thin, Lightweight LCD Cell," *SID 00 Digest* Section 13.4:168-169.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

THIN GLASS PROCESSING USING A CARRIER

CROSS-REFERENCE TO RELATED APPLICATIONS

This application is a continuation-in-part of U.S. patent application Ser. No. 12/908,763, filed Oct. 20, 2010, which is a divisional of U.S. patent application Ser. No. 12/351,767, filed Jan. 9, 2009 and issued as U.S. Pat. No. 7,918,019 on Apr. 5, 2011, the entire disclosure of both applications being incorporated herein by reference in its entirety for all purposes.

FIELD

This relates generally to the fabrication of circuit panels such as display panels for electronic devices, and more particularly, to the processing of a thin glass sheet by bonding it to a carrier substrate.

BACKGROUND

In recent years, mobile electronic devices have become hugely popular due to their portability, versatility, and ease-of-use. Although there are many different types of mobile electronic devices such as smart phones, portable music/video players, and tablet personal computers (PCs) currently available on the market, most of them share some basic components. In particular, most of these devices include a display such as a liquid crystal display (LCD) or an organic light-emitting diode (OLED) display. The display can be positioned partially or fully behind a touch sensor panel to form a touch screen, which has been widely adopted as an input device in various types of mobile electronic devices.

The display of a mobile electronic device typically includes a display panel, which may be made of glass or other suitable transparent substrate. To minimize the overall weight and thickness of the device, it is desirable to make the display panel of a device as thin as possible. Nevertheless, the thinness of a display panel is limited by the minimum thickness tolerance of existing manufacturing equipment. Display panels are typically fabricated from transparent substrates, such as glass sheets. Glass sheets that are too thin and may not fit the manufacturing equipment, and/or may be too fragile to withstand the rigors of the fabrication process. Most existing manufacturing equipment can only process glass sheets (or other similar transparent substrates) with a minimum thickness of, for example, 0.5 mm. Glass sheets that are thinner than the minimum thickness may be handled by the equipment, but with limited yield and capacity. Accordingly, existing display panel fabrication processes often require a thinning step to reduce the thickness of the display panel after most of the other processing steps on the panel have been performed. However, if a defect occurs during the thinning process and the display panel becomes unusable, all the pre-thinning processing on the panel can be wasted, which can potentially increase the cost of the overall fabrication of the display panels. Therefore, it is desirable to be able to fabricate display panels directly from thin glass.

SUMMARY

This relates to the manufacturing of thin display panels. As previously mentioned, existing equipment for manufacturing display panels has been designed with a minimum thickness tolerance of approximately 0.5 mm. This is because glass sheets (or other transparent material) used to fabricate display panels need to be at least about 0.5 mm thick in order to withstand the rigors of fabrication. Thinner glass sheets may cause handling problems during the fabrication process. Nevertheless, the methods disclosed in the various embodiments of the disclosure allow thin display panels with a thickness less than 0.5 mm to be fabricated using existing manufacturing equipment. In one embodiment, a thin glass sheet can be bonded to a carrier substrate such that the combined thickness of the glass sheet and the carrier substrate does not drop below about 0.5 mm when thin film processing is performed on the surfaces of the thin glass sheet during fabrication. The bonding of the thin glass sheet and the carrier substrate can be performed by oxidizing areas of the thin glass sheet and the carrier substrate, bringing the oxidized areas in contact with each other, and applying heat to the oxidized areas to bond the thin glass sheet and the carrier substrate. The processed thin glass sheet can eventually be separated from the carrier substrate and optionally divided into multiple thin display panels to be fitted in the final products.

DETAILED DESCRIPTION

In the following description of preferred embodiments, reference is made to the accompanying drawings which form a part hereof, and in which it is shown by way of illustration specific embodiments in which the disclosure can be practiced. It is to be understood that other embodiments can be used and structural changes can be made without departing from the scope of the embodiments of this disclosure.

This relates to the manufacturing of thin display panels. As previously mentioned, existing equipment for manufacturing display panels has been designed with a minimum thickness tolerance of approximately 0.5 mm. This is because glass sheets (or other transparent material) used to fabricate display panels need to be at least about 0.5 mm thick in order to withstand the rigors of fabrication. Thinner glass sheets may cause handling problems during the fabrication process. Nevertheless, the methods disclosed in the various embodiments of the disclosure allow thin display panels with a thickness less than 0.5 mm to be fabricated using existing manufacturing equipment. In one embodiment, a thin glass sheet can be bonded to a carrier substrate such that the combined thickness of the glass sheet and the carrier substrate does not drop below about 0.5 mm when thin film processing is performed on the surfaces of the thin glass sheet during fabrication. The bonding of the thin glass sheet and the carrier substrate can be performed by oxidizing areas of the thin glass sheet and the carrier substrate, bringing the oxidized areas in contact with each other, and applying heat to the oxidized areas to bond the thin glass sheet and the carrier substrate. The processed thin glass sheet can eventually be separated from the carrier substrate and optionally divided into multiple thin display panels to be fitted in the final products.

Although embodiments of this disclosure are described and illustrated herein in terms of fabricating display panels from a thin glass sheet, it should be understood that embodiments of this disclosure are not limited to such panels and substrates, but are generally applicable to other types of circuit panels such as touch sensor panels fabricated from thin substrates. In addition, in this specification 0.5 mm is used as the exemplary minimum thickness tolerance of existing equipment and the embodiments are described as being suitable for manufacturing display panels thinner than 0.5 mm. However, it should be understood that the minimum thickness tolerance of display panel (and other types of circuit panel) manufacturing equipment may vary, and is expected to improve over time. Nevertheless, the disclosed embodiments remain valid for fabricating panels having a thickness less than the exemplary minimum thickness tolerances described herein.

Figure 1A:
FIGS. 1a-1e illustrate the exemplary steps in a display panel fabrication process according to embodiments of the disclosure.
Figure 1A:

FIGS. 1a-1g illustrates exemplary steps of a display fabrication process using a carrier substrate according to embodiments of the disclosure. As illustrated in FIG. 1a, a thin glass sheet 100 less than 0.5 mm thick may be provided for fabricating a display panel. In addition to the thin glass sheet 100, a carrier substrate 102 may also be provided. The carrier substrate 102 can be another glass substrate. In other embodiments, the carrier substrate 102 can be a different substrate. The combined thickness of the thin glass sheet 100 and the carrier substrate 102 can meet the minimum requirement of existing equipment for thin film processing on the glass substrate.

Figure 1B:
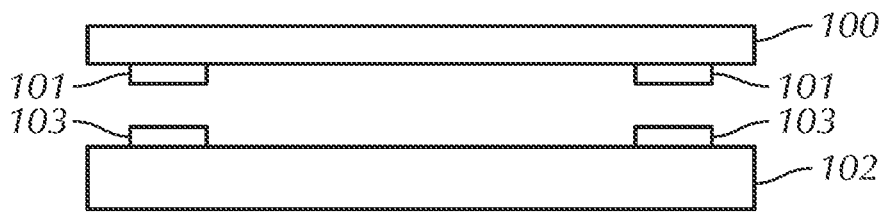

The thin glass sheet 100 and the carrier substrate 102 are then bonded together to form a bonded structure. In one embodiment, the bonding of the thin glass sheet 100 and the carrier substrate 102 can be facilitated by a bonding agent. In various embodiments, the bonding agent can be applied to either the thin glass sheet or the carrier substrate or both. For example, as shown in FIG. 1b, an area on one of the surfaces of the thin glass sheet 100 can be oxidized with a bonding agent 101 such as silicon dioxide (SiO$_2$). Similarly, an area on a surface of the thin carrier substrate can also be oxidized with the bonding agent 103. Other possible bonding agents include, but are not limited to, epoxies, silicone adhesives, glass frit bonding, metallization (e.g., solder), acrylics, urethanes, synthetic rubbers, and elastomers. These bonding agents can be applied as a liquid (or gel) or as the adhesive in adhesive tape.

The bonding agent can be applied in a predefined pattern on the surfaces of the thin glass sheet 100 and the carrier substrate 102. For example, as shown in a top view of a rectangular thin glass sheet 200 of FIG. 2a, the bonding agent can be applied continuously in a narrow strip 202 along the border area the thin glass sheet 200. Essentially, the narrow strip 200 of bonding agent can form a bonding area on the thin glass sheet 200. Although not shown, the bonding agent can be applied in a matching pattern on a surface of the carrier substrate so that when the thin glass sheet 200 and the carrier substrate are brought in contact with each other, the bonding area 202 of the thin glass sheet 200 and the bonding area of the carrier substrate 102 can substantially overlap.

Figure 2A:
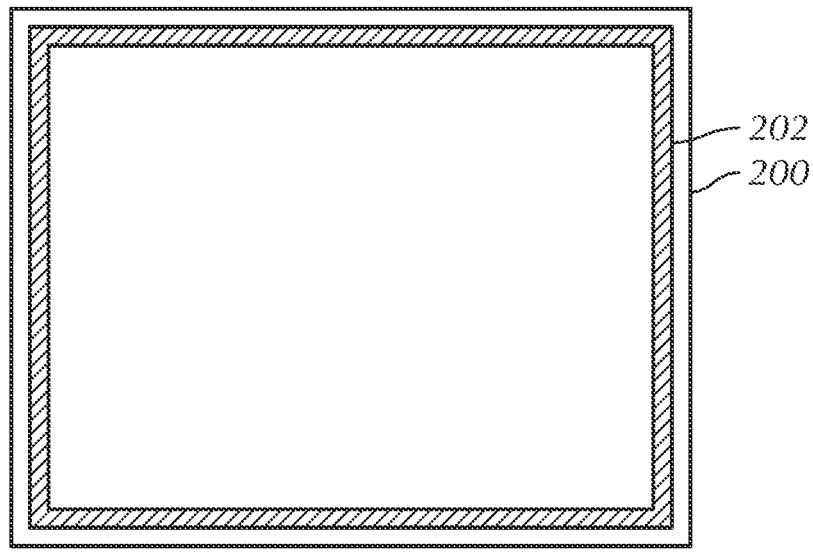
FIGS. 2a and 2b illustrate the exemplary bonding areas on a surface of the thin glass sheet according to embodiments of the disclosure.
Figure 2B:
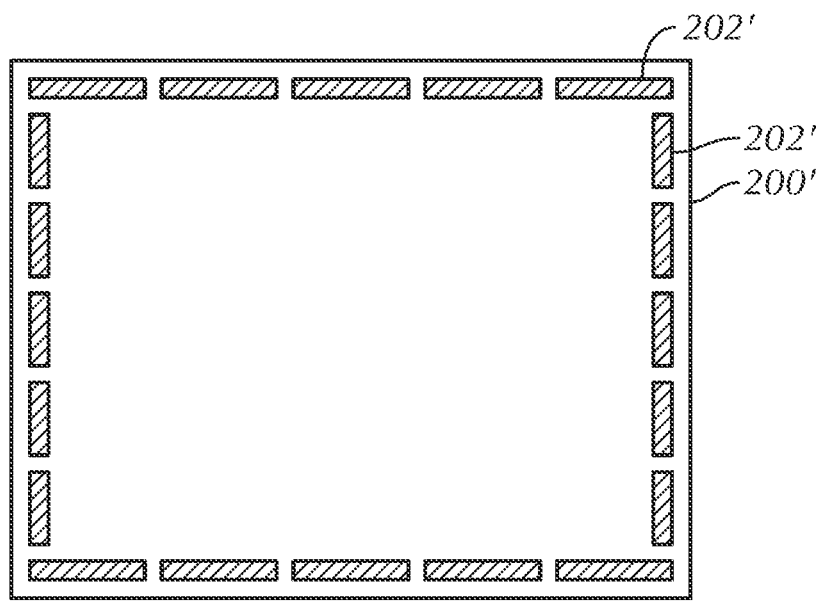

In another example, as shown in FIG. 2b, the bonding agent can be deposited in a discontinuous pattern 202' along the border area on the top surface of the thin glass sheet 200'. Similarly, the bonding agent can be deposited in a matching pattern on the surface of the carrier substrate (not shown). It should also be understood that the bonding agent can be deposited in patterns different from those shown in FIGS. 2a and 2b so long as they can sufficiently bond the thin glass sheet and the carrier substrate and the bonded structure can be rigid enough to sustain subsequent processing. Although FIGS. 2a and 2b show rectangular thin glass sheets 200, 200', it should be understood that the thin glass sheets 200, 200' can be square, circular, or in any other shape. The bonding area on each thin glass sheet may also vary based on the shape of the thin glass sheet.

Figure 1C:
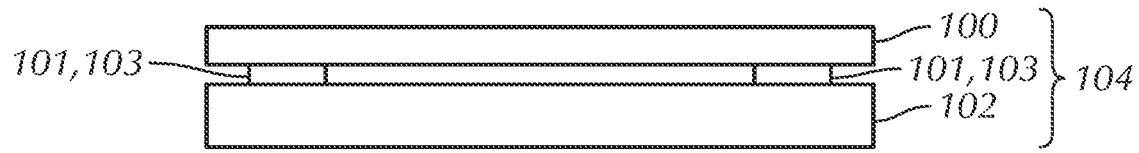

Referring to FIG. 1c, after the bonding agent is applied to the surfaces of the thin glass sheet 100 and the carrier substrate 102, the thin glass sheet 100 and the carrier substrate 102 can be bonded together by the bonding agent 101, 103 to form a sandwich structure 104. In one embodiment, the bonding can be facilitated by aligning the bonding area on one surface of the thin glass sheet 100 with the bonding area on the opposing surface of the carrier substrate 102 and bringing the bonding areas in contact with each other. Once in contact, and under the right conditions such as the right temperature and/or pressure, the bonding agent between the thin glass sheet 100 and the carrier substrate can bond the two substrates together. In another embodiment, when a thin glass sheet is to be bonded with another glass substrate, both substrates can be already oxidized and may be bonded with the application of temperature and/or pressure.

In the embodiment where SiO$_2$ is used as the bonding agent and deposited in the bonding areas of both substrates, the bonding areas can be oxidized. When the oxidized bonding areas are brought in contact with each other and annealed, a bond can be formed to effectively bond the thin glass sheet 100 and the carrier substrate 102. After the thin glass sheet 100 and the carrier substrate 102 are bonded together, the outer surface of the thin glass sheet can optionally be ground and/or polished prior to being processed further.

Although the thin glass sheet 100 by itself may not be thick enough to be suitable for processing by existing manufacturing equipment, the sandwich can have a thickness no less than the combined thickness of the thin glass sheet 100 and the carrier substrate 102, which can meet the minimum thickness requirement of existing manufacturing equipment. For example, if a thin glass sheet of 0.1 mm thick is bonded to a carrier substrate 0.5 mm thick, the bonded structure can have a thickness of at least 0.6 mm which is more than the 0.5 mm thickness requirement of existing manufacturing equipment. As such, the sandwich of the thin glass sheet 100 and carrier substrate 102 may be processed by existing manufacturing equipment without any modifications to the equipment.

In the embodiment where the bonding agent is deposited continuously around the border area, as shown in FIG. 2a, the thin glass sheet 200 and the carrier substrate are bonded around their border areas. Because the bonding area can form a continuous strip 202 along the border of the thin glass sheet 200, the bonding between the thin glass sheet 200 and the carrier substrate can essentially create a seal between the thin glass sheet 200 and the carrier substrate. In some embodiments, the space sealed between the thin glass sheet 200 and the carrier substrate can be at a vacuum for improved rigidity of the bonded structure and compatibility with low pressure and wet processes to be performed on the bonded structure. In contrast, the segmented bonding areas 202' of FIG. 2b may require less bonding agent. However, the space between the thin glass sheet 200' and the carrier substrate in the bonded structure may not be sealed. In various embodiments, a layer of inert material can be deposited in the areas outside of the bonding area to prevent the thin glass sheet from bonding with the carrier substrate in those areas. An example of such inert material is Silicon Nitride (SiNx).

Figure 1D:
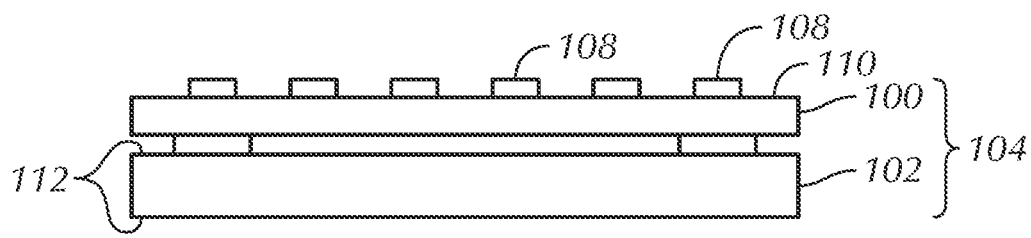

Referring to FIG. 1d, thin film and litho/etch processes may be performed on the sandwich 104 to form thin film patterns 108 on the outer surface 110 of the thin glass sheet 100. In one embodiment, thin film transistor (TFT) processing can be performed on the thin glass sheet 100. TFT processing can include depositing one or more thin films of a semiconductor active layer, dielectric layer, and metallic contacts on the surface 110 of the thin glass sheet 100 and patterning the deposited layer(s). In other embodiments where the thin glass sheet 100 is used for fabricating other types of circuit panels such as touch sensor panels, the thin film and litho/echo process can include depositing and patterning transparent materials, such as indium tin oxide (ITO), to form conductive traces (e.g., sense and drive lines) for carrying touch signals of the touch sensor panels. Alternatively or additionally, the thin film patterns 108 may include a metal layer including metal traces for routing signals. Alternatively or additionally, the thin film patterns 108 may be used as an anti-reflective material. Alternatively or additionally, the thin film patterns 108 may be used as a protective layer and may include ceramic material or any other material with similar protective properties. The type of thin film used and the pattern formed may depend on the ultimate use of the circuit panels made from the thin glass sheet 100. It should be noted that the thin film and litho/etch process may not result in coating or patterning of the carrier substrate 102 in this embodiment. That is, no layers or patterns may be deposited on any of the surfaces 112 of the carrier substrate 102.

Figure 1E:
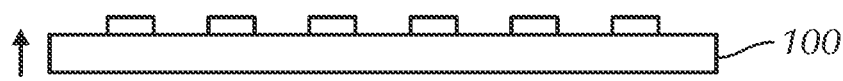
Figure 1E:
Figure 3A:
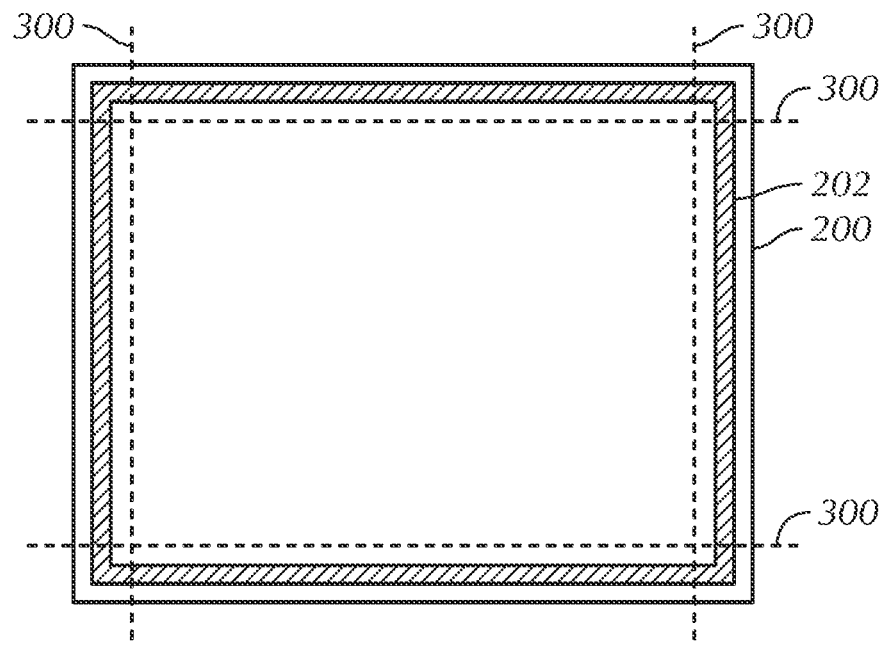
FIGS. 3a and 3b illustrate an exemplary cutting step in the display panel fabrication process according to embodiments of the disclosure.

Next, as illustrated in FIG. 1e, the patterned thin glass sheet 100 can be separated from the carrier substrate 102. The separation can be done using any suitable method. In one embodiment, the thin glass sheet 100 and the carrier substrate 102 can be separated by cutting the glass mechanically. FIG. 3a provides a top view of the thin glass sheet 200 of FIG. 2a with the addition of four scribe lines (collectively 300) along which the thin glass sheet 200 can be cut. As shown, each of the four scribe lines 300 can be substantially parallel to a respective edge of the rectangular thin glass sheet 100 and form a square just inside of the bonding area. Each of the scribe lines 200 can extend from one edge of the thin glass sheet 200 to the opposite edge. The actual cuts can be done using mechanisms such as scribing and breaking, water jet cutting, and laser scribing.

Figure 3B:
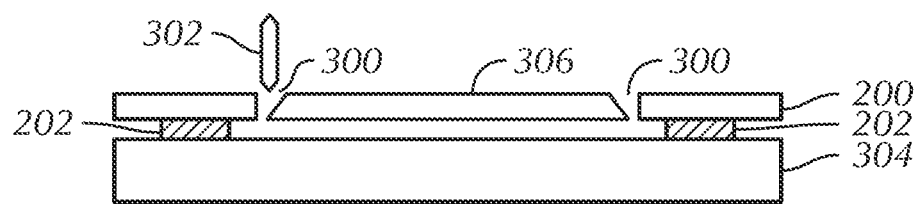

FIG. 3b provides a side section view of the thin glass sheet 200 being cut along the scribe lines 300. Because the thin glass sheet 200 and the carrier substrate 304 are only bonded by the bonding agent in the narrow bonding areas 202, the center portion 306 of the thin glass sheet 200 is not in contact with any portion of the carrier substrate 304 when the thin glass sheet 200 and the carrier substrate 304 are bonded. Thus, by cutting along the scribe lines 300 using a cutting tool 302, the center portion 306 of the thin glass sheet 200 can be separated from the rest of the bonded structure. The separated center portion 306 of the thin glass sheet 200 can have the desired thickness (i.e., the thickness of the thin glass sheet) for end product implementation without requiring any additional thinning steps to be performed. In some embodiments where the thin glass sheet 200 is large in size, the center portion 308 separated from the bonded structure can be further cut into an array or matrix of smaller sections, each of which can then be used as a display circuit in an end product. This can allow a large number of display panels to be efficiently produced.

In other embodiments, the number, lengths, and locations of the scribe lines can vary depending on a number of factors such as the size and shape of the thin glass sheet, the pattern of the bonding area, and the desired shape and size of the portion of the thin glass sheet to be cut from the bonded structure.

Figure 3C:
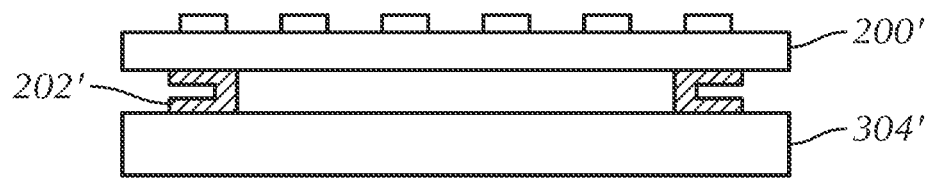
FIG. 3c illustrates an exemplary chemical etching step in the display panel fabrication process according to embodiments of the disclosure.

Alternatively chemical etching of the bonding agent can also separate the thin glass sheet from the carrier substrate. FIG. 3c illustrates an exemplary chemical etching process on the bonding agent 202' between the thin glass sheet 202' and the carrier substrate 304'. The etching process can eventually remove the bonding agent completely, thus freeing the processed thin glass sheet 200' from the carrier substrate 304'.

Figure 4:
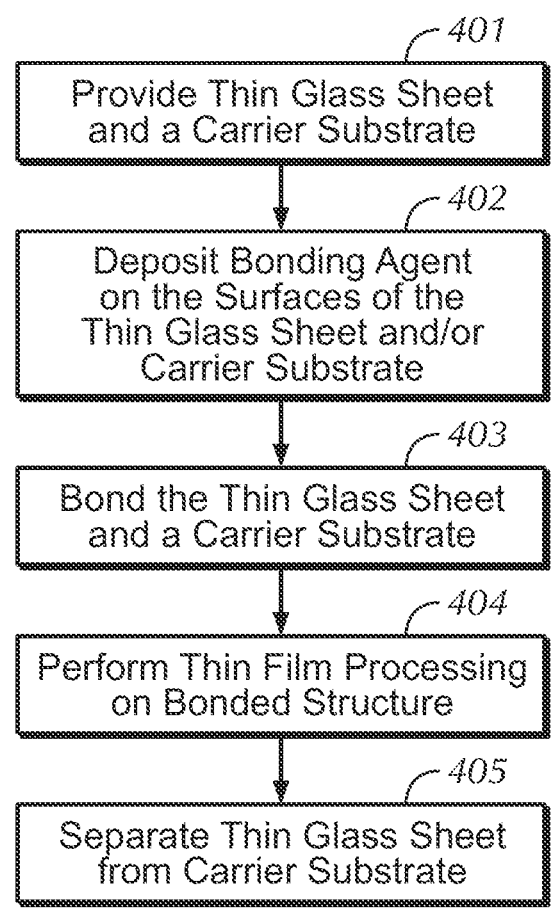
FIG. 4 is a flow chart illustrating the exemplary steps in the display panel fabrication process according to embodiments of the disclosure.

FIG. 4 is a flow chart illustrating the exemplary operations in the display panel fabrication process according to embodiments of the disclosure. First, a thin glass sheet and a carrier substrate can be provided (401). The thin glass sheet can have a thickness less than the minimum thickness required by existing display panel manufacturing equipment. However, the combined thickness of the thin glass sheet and the carrier substrate can be no less than the minimum thickness required by the existing equipment. The carrier substrate can also be a glass substrate. Next, a bonding agent can be deposited on the surfaces of the thin glass sheet and/or the carrier substrate (402). The bonding agent can be an oxidizing agent (e.g., $SiO_2$) that oxidizes at least an area on the surface of the thin glass sheet and an area on the surface of the carrier substrate. The thin glass sheet and the carrier substrate can then be bonded with the bonding agent (403). This may require, for example, heating the thin glass sheet and the carrier substrate to create an oxide layer from the bonding agent between the two substrates.

After the thin glass sheet and the carrier substrate are bonded to form a sandwich, thin film processing and/or other types of processing can be performed on the sandwich to transform the thin glass sheet into one or more display panels. This processing step can be performed using existing manufacturing equipment because the thickness of the sandwich can meet the requirement of this equipment. Finally, the processing thin glass sheet can be separated from the carrier substrate (405) by mechanical means or chemical etching or any other suitable methods. The separated thin glass sheet can optionally be divided into multiple sections, each of which can be a display panel to be installed in an end product. Unlike conventional display panel fabrication processes, the resulting thin glass sheet(s) do not require additional thinning steps because the glass sheet being processed is already thin to start with.

Although the above-described embodiments are directed to fabricating one or more display panels from a thin glass sheet, it should be understood that the same process can be easily adopted in the fabrication of other types of circuit panels such as touch sensor panels. It should also be understood that, depending on the actual panels being fabricated, the thin substrate used in fabrication can be a substrate other than glass. Additionally, it should also be understood that the processing performed on the bonded structured is not limited to those described herein, but can include any type of processing in the fabrication of circuit panels. Similarly, the mechanisms for separating the two substrates are not limited to those described herein, but can include any known methods suitable for use in fabrication processes such as the one described in the embodiments above.

Figure 5A:
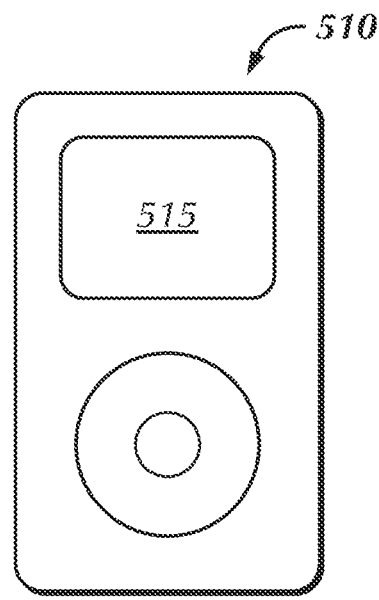
FIG. 5a illustrates an exemplary digital media player having a display panel fabricated according to embodiments of the disclosure.

FIG. 5a illustrates exemplary digital media player 510 that can include thin display panel 515 fabricated according to embodiments of the disclosure.

Figure 5B:
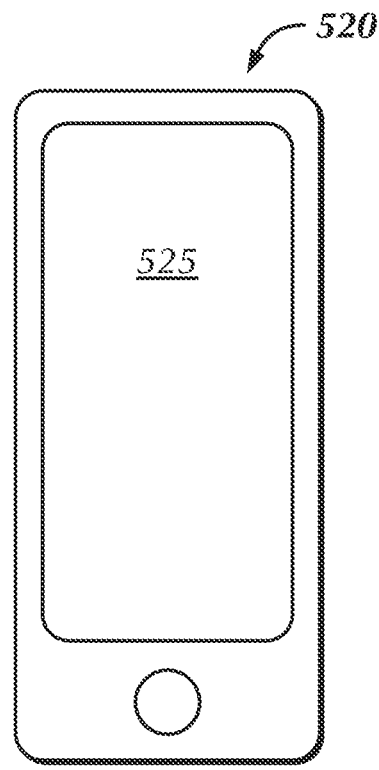
FIG. 5b illustrates an exemplary mobile telephone having a display panel fabricated according to embodiments of the disclosure.

FIG. 5b illustrates exemplary mobile telephone 520 that can include thin display panel 525 fabricated according to embodiments of the disclosure.

Figure 5C:
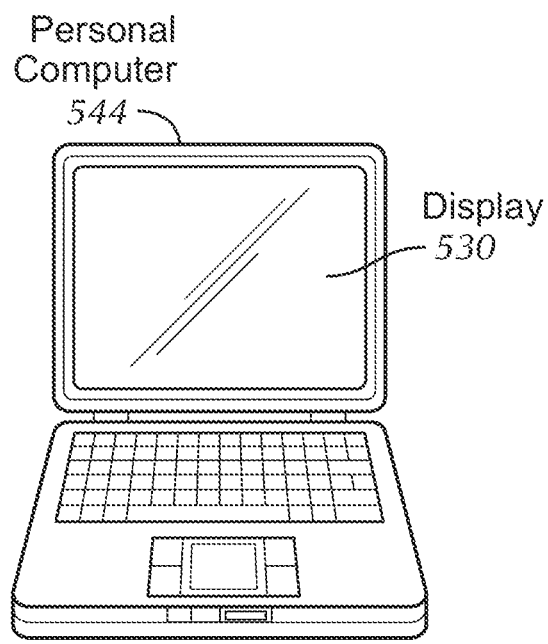
FIG. 5c illustrates an exemplary mobile computer having a display panel fabricated according to embodiments of the disclosure.

FIG. 5c illustrates an exemplary personal computer 544 that can include display device 530 fabricated according to embodiments of the disclosure.

Figure 5D:
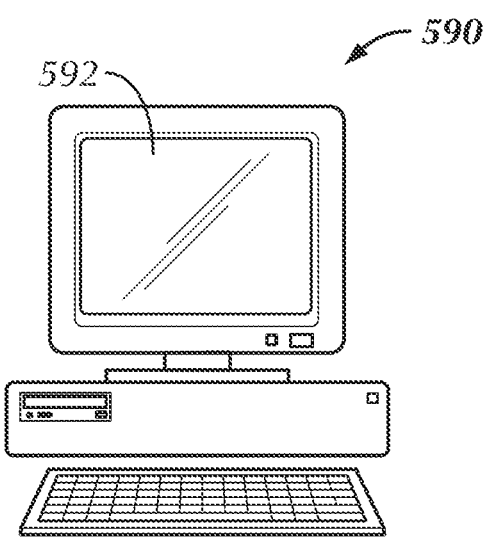
FIG. 5d illustrates an exemplary desktop computer having a display panel fabricated according to embodiments of the disclosure.

FIG. 5d illustrates an exemplary desktop computer 590 including a display device 592 fabricated according to embodiments of the disclosure.

The devices (or parts of the devices) of FIGS. 5a-5d can achieve lighter weights utilizing thin display panels fabricated according to embodiments of the disclosure.

Figure 6:
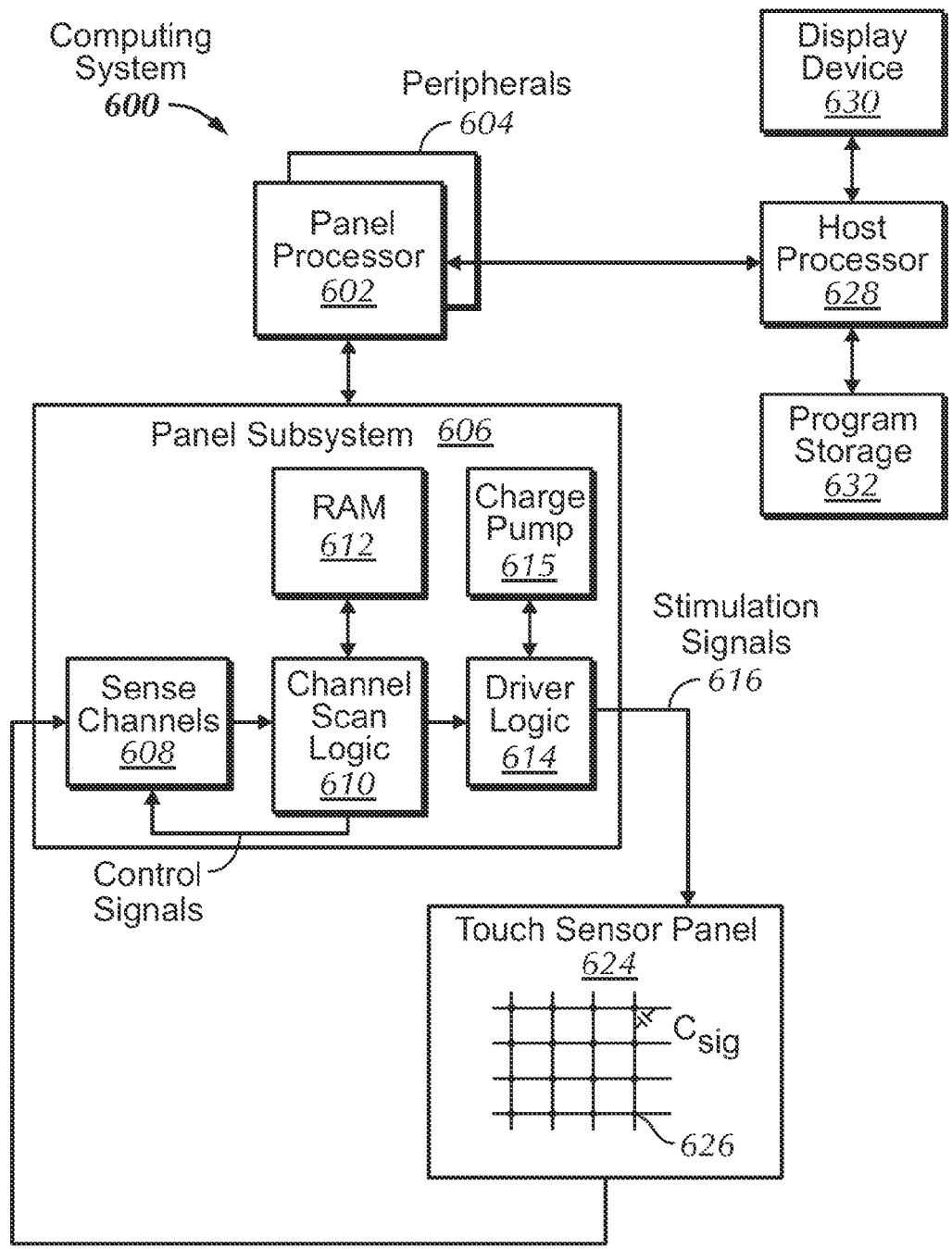
FIG. 6 illustrates an exemplary computing system including a touch sensor panel fabricated according to embodiments of the disclosure.

FIG. 6 illustrates exemplary computing system 600 that can include one or more DITO or SITO touch sensor panels fabricated according to the embodiments of the disclosure described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Either or both of the drive and sense lines can be coupled to a thin glass sheet according to embodiments of the disclosure. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be coupled to program storage 632 and display device 630 such as an LCD panel for providing a UI to a user of the device. Display device 630 together with touch sensor panel 624, when located partially or entirely under the touch sensor panel, can form touch screen 618.

Note that one or more of the functions described above can be performed by firmware stored in memory (e.g. one of the peripherals 604 in FIG. 6) and executed by panel processor 602, or stored in program storage 632 and executed by host processor 628. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although embodiments of this disclosure have been fully described with reference to the accompanying drawings, it is to be noted that various changes and modifications will become apparent to those skilled in the art. Such changes and modifications are to be understood as being included within the scope of embodiments of this disclosure as defined by the appended claims.

What is claimed is:

1. A method of fabricating a display panel from a thin substrate using a carrier substrate comprising:

depositing a bonding agent on a first surface of the thin substrate;

depositing a bonding agent on a second surface of the carrier substrate;

bonding the thin substrate and the carrier substrate with the bonding agent deposited on the first surface and the second surface;

performing thin film processing on a third surface of the thin substrate opposite the first surface; and separating the processed thin substrate from the carrier substrate, wherein the thin substrate has a thickness less than a required thickness for sustaining thin film processing while a thickness of the bonded thin substrate and the carrier substrates is greater than or equal to the required thickness.

2. The method of claim 1, wherein the thin substrate is glass.

3. The method of claim 1, wherein the carrier substrate is glass.

4. The method of claim 1, wherein the bonding agent is one of $SiO_2$, epoxies, silicone adhesives, glass frit bonding, solder, acrylics, urethanes, synthetic rubbers, and elastomers.

5. The method of claim 4, wherein bonding the thin substrate and the carrier substrate further comprises:

oxidizing an area on the first surface of the thin substrate;

oxidizing an area on the second surface of the carrier substrate; and forming an oxide layer between the oxidized area on the first surface of the thin substrate and the oxidized area on the second surface of the carrier substrate by annealing.

6. The method of claim 5, further comprising separating the thin substrate from the carrier substrate by cutting along a plurality of scribe lines located on a third surface of the thin substrate.

7. The method of claim 6, wherein the carrier substrate is glass.

8. The method of claim 7, wherein the thin substrate is glass.

9. The method of claim 6, wherein cutting along the plurality of scribe lines is performed by water jet cutting.

10. The method of claim 6, wherein cutting along the plurality of scribe lines is performed by laser cutting.

11. The method of claim 1, wherein the bonding agent is deposited in a continuous pattern along the border area of the first surface.

12. The method of claim 11, wherein a bonding between the thin substrate and the carrier substrate forms a seal sealing a space between the thin substrate and the carrier substrate.

13. The method of claim 12, wherein the space is a vacuum.

14. The method of claim 1, wherein the bonding agent is deposited in a segmented pattern on the first surface.

15. The method of claim 1, wherein performing thin film processing on a third surface of the thin substrate further comprises performing thin film transistor processing.

16. The method of claim 1, wherein separating the processed thin substrate from the carrier substrate further comprises:

locating a plurality of scribe lines on the third surface of the thin substrate; and cutting along the plurality of scribe lines to separate a portion of the thin substrate from the carrier substrate.

17. The method of claim 16, wherein the plurality of scribe lines defines an outer boundary of the display panel.

18. The method of claim 16, wherein the plurality of scribe lines include four scribe lines forming a rectangle.

19. The method of claim 1, further comprising dividing the separated, processed thin substrate into a plurality of display panels.

20. The method of claim 1, wherein separating the processed thin substrate from the carrier substrate further comprises chemically etching a bonding between the thin substrate and the carrier substrate.

21. The method of claim 1, where in the required thickness is 0.5 mm.

\* \* \* \* \*